United States Patent
Barkai

(10) Patent No.: US 10,491,179 B2
(45) Date of Patent: Nov. 26, 2019

(54) ASYMMETRIC MULTI-CHANNEL AUDIO DYNAMIC RANGE PROCESSING

(71) Applicant: Nuvoton Technology Corporation, Hsin-chu (TW)

(72) Inventor: Ittai Barkai, Tel Aviv (IL)

(73) Assignee: NUVOTON TECHNOLOGY CORPORATION, Hsin-Chu (TW)

(*) Notice: Subject to any disclaimer, the term of this patent is extended or adjusted under 35 U.S.C. 154(b) by 131 days.

(21) Appl. No.: 15/713,757

(22) Filed: Sep. 25, 2017

(65) Prior Publication Data
US 2019/0097595 A1  Mar. 28, 2019

(51) Int. Cl.
| H04R 5/00 | (2006.01) |
| H04S 1/00 | (2006.01) |
| H03G 1/00 | (2006.01) |
| G11B 20/10 | (2006.01) |
| H03G 3/30 | (2006.01) |
| H03G 7/00 | (2006.01) |
| G11B 20/00 | (2006.01) |

(52) U.S. Cl.
CPC ..... H03G 1/0005 (2013.01); G11B 20/10324 (2013.01); H03G 3/3005 (2013.01); H03G 3/3089 (2013.01); H03G 7/002 (2013.01); H04S 1/00 (2013.01); H04S 1/002 (2013.01); G11B 2020/00014 (2013.01)

(58) Field of Classification Search
CPC .......... H03G 1/005; H03G 3/3089; G11B 20/10324; G11B 2020/00014; H04S 1/00; H04S 1/002; H04S 1/007; H04S 7/00; H04S 7/30; H04R 5/00; H04R 5/04

USPC ....... 381/1, 77, 80, 320, 321, 104, 106, 107, 381/109; 333/14; 455/72
See application file for complete search history.

(56) References Cited

U.S. PATENT DOCUMENTS

| 6,731,767 | B1 | 5/2004 | Blamey et al. |
| 7,072,477 | B1 | 7/2006 | Kincaid |
| 7,305,100 | B2 | 12/2007 | Pedersen |
| 8,428,270 | B2 | 4/2013 | Crockett et al. |
| 8,600,076 | B2 | 12/2013 | Choi et al. |
| 9,130,527 | B2 | 9/2015 | Potard |
| 2010/0202631 | A1* | 8/2010 | Short ............... H03G 3/32 381/104 |
| 2015/0310875 | A1* | 10/2015 | Rennies ......... G10L 21/0364 704/225 |
| 2015/0317982 | A1* | 11/2015 | Hurtado-Huyssen ........ G10L 19/005 704/500 |

* cited by examiner

*Primary Examiner* — Xu Mei
(74) *Attorney, Agent, or Firm* — Kligler & Associates

(57) ABSTRACT

A method for audio processing includes receiving multiple electrical signals to be transmitted in parallel via multiple respective audio channels. Multiple respective weights are assigned to the multiple electrical signals, wherein at least two of the weights differ from one another. An instantaneous gain is calculated, to be applied to the multiple electrical signals. The instantaneous gain depends on (i) instantaneous amplitudes of the multiple electrical signals, and (ii) the weights assigned to the multiple electrical signals. The instantaneous gain is applied to the multiple electrical signals, and the multiple electrical signals are transmitted via the multiple respective audio channels.

12 Claims, 1 Drawing Sheet

ASYMMETRIC MULTI-CHANNEL AUDIO DYNAMIC RANGE PROCESSING

FIELD OF THE INVENTION

The present invention relates generally to audio processing, and particularly to methods and systems for dynamic range processing.

BACKGROUND OF THE INVENTION

Various audio signal processing techniques involve controlling the dynamic range of audio signals. Such processing may comprise, for example, dynamic range compression, limiting, expansion or other suitable operation. Various schemes for audio dynamic range control are known in the art.

SUMMARY OF THE INVENTION

An embodiment of the present invention that is described herein provides a method for audio processing, including receiving multiple electrical signals to be transmitted in parallel via multiple respective audio channels. Multiple respective weights are assigned to the multiple electrical signals, wherein at least two of the weights differ from one another. An instantaneous gain is calculated, to be applied to the multiple electrical signals. The instantaneous gain depends on (i) instantaneous amplitudes of the multiple electrical signals, and (ii) the weights assigned to the multiple electrical signals. The instantaneous gain is applied to the multiple electrical signals, and the multiple electrical signals are transmitted via the multiple respective audio channels.

In some embodiments, assigning the weights includes setting the weights so as to compensate for a difference in transfer function between at least two of the audio channels. In some embodiments, calculating and applying the instantaneous gain includes mapping a dynamic range of the multiple electrical signals from a first dynamic range to a second, different dynamic range.

In an embodiment, calculating the instantaneous gain includes (i) applying the weights to the electrical signals, to produce weighted signals, (ii) calculating respective absolute values of the weighted signals, and (iii) calculating the instantaneous gain based on an instantaneous maximum of the absolute values.

In a disclosed embodiment, assigning the weights includes setting the weights so as to compensate for a difference between respective resonance frequencies in at least two of the audio channels. In another embodiment, assigning the weights includes setting the weights so as to compensate for a difference between respective non-linear response ranges in at least two of the audio channels.

There is additionally provided, in accordance with an embodiment of the present invention, an apparatus for audio processing including processing circuitry and multiple gain stages. The processing circuitry is configured to receive multiple electrical signals that are to be transmitted in parallel via multiple respective audio channels, to assign multiple respective weights to the multiple electrical signals, wherein at least two of the weights differ from one another, and to calculate an instantaneous gain to be applied to the multiple electrical signals, wherein the instantaneous gain depends on (i) instantaneous amplitudes of the multiple electrical signals, and (ii) the weights assigned to the multiple electrical signals. The multiple gain stages are configured to apply the instantaneous gain to the multiple electrical signals, and to transmit the multiple signals via the multiple respective audio channels.

The present invention will be more fully understood from the following detailed description of the embodiments thereof, taken together with the drawings in which:

DETAILED DESCRIPTION OF EMBODIMENTS

Overview

Figure 1:
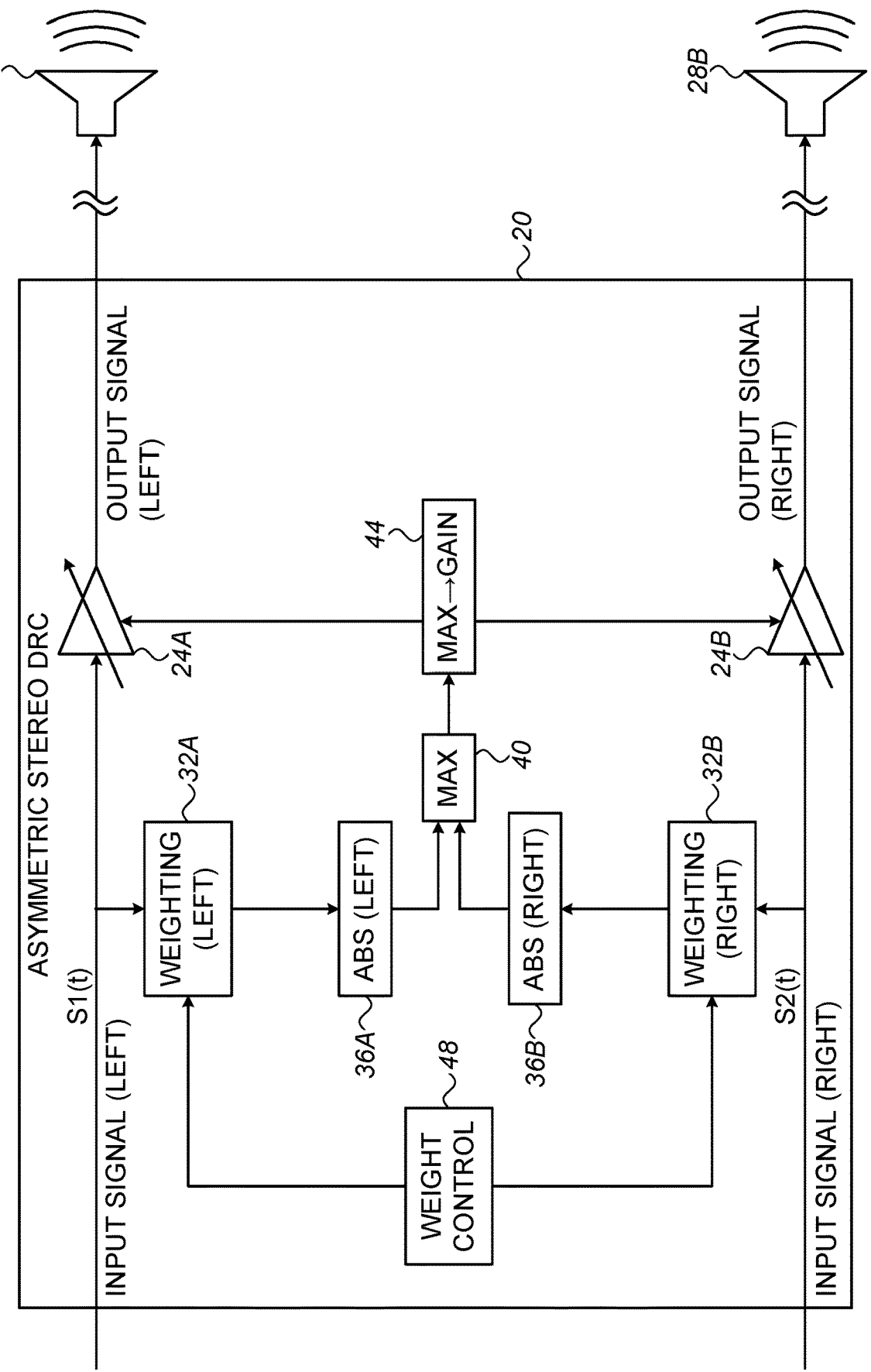
FIG. 1 is a block diagram that schematically illustrates an asymmetric multi-channel Dynamic Range Compressor (DRC), in accordance with an embodiment of the present invention.

Embodiments of the present invention that are described herein provide improved methods and systems for controlling the dynamic range of multi-channel audio signals. The description that follows refers initially to a stereo Dynamic Range Compressor (DRC), for the sake of clarity. The principles of the disclosed techniques are then generalized and applied to various other types of audio equipment and use-cases.

In an example embodiment, a stereo DRC receives as input two electrical signals, which comprise respective right and left components of a stereo signal. The two electrical signals are to be transmitted via two respective audio channels, in the present example right and left loudspeakers. The DRC is configured to compress the dynamic range of the two electrical signals, e.g., in order to protect the loudspeakers or as part of a suitable sound design scheme.

In the present example, the DRC compresses the dynamic range by (i) estimating the instantaneous amplitudes of the two electrical signals, (ii) calculating an instantaneous gain based jointly on the two instantaneous amplitudes, and (iii) applying the instantaneous gain to the two electrical signals. Note that the DRC applies the same instantaneous gain to both electrical signals, even though their instantaneous amplitudes may be different. For example, the DRC may set the instantaneous gain based on the maximum of the two instantaneous amplitudes. Joint gain setting of this sort avoids undesired audio artefacts.

In many practical scenarios, the audio channels over which the signals are transmitted differ from one another in transfer function (e.g., in gain, phase, delay and/or spectral response). As will be detailed below, the term "audio channel" refers to the entire channel traversed by the electrical and/or acoustic signals.

In some embodiments of the present invention, the DRC assigns different respective weights to the two electrical signals, and calculates the instantaneous gain based on the instantaneous amplitudes of the electrical signals and the weights. In an example embodiment, the DRC (i) scales the two electrical signals by the respective weights, then (ii) calculates the absolute values of the scaled electrical signals, then (iii) takes the maximum of the absolute values, and finally (iv) sets the instantaneous gain based on this maximum.

Various other methods of calculating the instantaneous gain, while applying different weights to the two electrical signals, can be used. The weights may be fixed or adaptive. By proper assignment of the weights, the DRC is able to compress the dynamic range of the stereo signal while compensating for the difference in transfer function between the audio channels. This sort of compensation results in improved perceived audio quality for the listener.

In alternative embodiments, the disclosed techniques can be implemented in other types of audio equipment and used for compensating for differences between various other types of audio channels. Some non-limiting examples comprise stereo systems that use different-size left and right loudspeakers, transmission of stereo signals via the speaker and earpiece of a mobile phone, hearing aids that compensate for unequal left/right hearing ability, and the like. Moreover, the disclosed techniques can be used with more than two signals and respective audio channels, e.g., in quadrophonic or other multi-channel audio systems.

System Description

FIG. 1 is a block diagram that schematically illustrates an asymmetric stereo audio Dynamic Range Compressor (DRC) 20, in accordance with an embodiment of the present invention. The description that follows explains the structure and operation of DRC 20, purely by way of example. Alternative implementations, use-cases and applications are addressed further below.

In the embodiment of FIG. 1, DRC 20 receives as input two electrical signals $S1(t)$ and $S2(t)$, which convey the left and right components of a stereo signal, respectively. DRC 20 comprises two gain stages 24A and 24B, which apply a suitable gain to the respective input signals. In the present example gain stages 24A and 24B comprise variable-gain amplifiers. Alternatively, the gain stages may be implemented using variable attenuators. The DRC typically comprises additional gain stages (not shown in the figure) that typically have fixed gains.

The resulting electrical signals at the outputs of gain stages 24A and 24B are provided to left and right loudspeakers 28A and 28B, respectively. Speakers 28A and 28B serve as electro-acoustic transducers that convert the left and right output signals into acoustic signals. The acoustic signals propagate via the air medium until reaching a human listener.

Each of the two input signals $S1(t)$ and $S2(t)$ has an instantaneous (momentary) amplitude, which varies as a function of time as a function of the instantaneous volume of the audio conveyed by the signal. Each of the input signals has a certain dynamic range. The dynamic range is typically defined as the ratio between the maximal and minimal absolute-value signal amplitude, and may be defined on a linear or logarithmic (dB) scale.

For various reasons it is sometimes desirable to compress the dynamic range of the input signals, i.e., to cause the output signals to have a smaller dynamic range than the corresponding input signals. Dynamic range compression is useful, for example, for protecting speakers 28A and 28B and/or for proper sound design.

In addition, in many practical cases the audio channels over which the signals are transmitted differ from one another in transfer function. In the context of the present patent application and in the claims, the term "difference in transfer function" refers to differences in gain (including linear and/or non-linear gain), phase, delay and/or spectral response across the relevant signal bandwidth.

The term "difference" in this context does not necessarily imply additive difference, but to broadly indicate that the two transfer functions are not the same. The difference between the audio channels may be additive, multiplicative or any other.

In the context of the present patent application and in the claims, the term "audio channel" refers to the entire channel traversed by the electrical signal and/or the acoustic signal produced from the electrical signal. The audio channel may comprise, for example, electronic circuitry that processes the electrical signal (before the DRC, in the DRC or after the DRC), any electro-acoustic transducer (e.g., speaker 28) that converts the electrical signal into the corresponding acoustic signal, the physical medium via which the acoustic signal propagates, any electro-acoustic transducer that may convert the acoustic signal back into an electrical signal (e.g., a microphone used for recording), and even the listener's hearing ability pertaining to the acoustic signal.

The difference in transfer function between the audio channels may be caused by any of the components of the audio channels, possibly by a combination of several components. The difference in transfer function between audio channels may be caused by various reasons, some of which may be intentional (e.g., speakers of different sizes) and some of which may be unintentional (e.g., unequal hearing ability, or damage or aging of one or more components). The difference in transfer function between audio channels may be fixed in time, or it may be time-varying.

In some embodiments, DRC 20 comprises processing circuitry that carries out the dynamic range compression techniques described herein. In particular, the processing circuitry accounts for the differences in transfer function between different audio channels. In the example of FIG. 1, the processing circuitry comprises weighting units 32A and 32B, absolute-value calculation units (ABS units) 36A and 36B, a maximum calculation unit (MAX unit) 40, a gain mapping unit 44, and a weight control unit 48.

In the example embodiment of FIG. 1, weighting unit 32A receives input signal $S1(t)$ and multiplies it by a weight denoted W1. ABS unit 36A calculates the instantaneous absolute value of the weighted input signal, i.e., $|W1 \cdot S1(t)|$. At the same time, weighting unit 32B receives input signal $S2(t)$ and multiplies it by a weight denoted W2. W2 is typically different from W1. The difference between the two weights (e.g., the ratio between them) aims to compensate for the difference between the transfer functions of the two audio channels traversed by $S1(t)$ and $S2(t)$. ABS unit 36B calculates the instantaneous absolute value of the weighted input signal, i.e., $|W2 \cdot S2(t)|$.

The outputs of ABS units 36A and 36B are provided to MAX unit 40. MAX unit 40 continuously outputs the largest of its inputs, i.e., $M(t)=\text{Max}\{|W1 \cdot S1(t)|, |W2 \cdot S2(t)|\}$. $M(t)$ is a time-varying function that tracks the maximum of the absolute value of the weighted input signals.

Gain mapping unit 44 continuously translates $M(t)$ into a respective gain value $G(t)$. This mapping applies the actual dynamic range compression. The mapping $M(t) \rightarrow G(t)$ applied by unit 44 may comprise any suitable mapping.

Consider, as a non-limiting example, a dynamic range compression scheme that (i) compares the instantaneous energy of the input signal to a preset threshold, and (ii) if the instantaneous energy is above the threshold, compresses the input signal by a certain ratio, e.g., expressed in dB. Such a scheme is useful, for example, in consumer electronic audio equipment, e.g., in television sets. In one example implementation, the threshold is set to −12 dBFS (12 dB below the input signal's full-scale level). The compression ratio can be set to any desired value, e.g., a ratio of 2:1, 4:1 or 10:1. The compression ratio in this example is typically applied to the portion of the signal that exceeds the threshold. Alternatively, any other suitable $M(t) \rightarrow G(t)$ mapping can be used.

The mapping of M(t) to G(t) may be represented as an analytical function of M(t) that yields G(t), as a look-up table, or in any other suitable way. In one example embodiment, unit 44 is implemented as a cascade of a linear-to-dB conversion, a logarithmic dynamic-range mapping function, a smoothing filter, and a dB-to-linear conversion.

The resulting gain G(t) is a time-varying function. The processing circuitry of DRC 20 continuously sets the gains of gain stages 24A and 24B to G(t). As can be seen from the above description, G(t) is calculated while giving different weights to different input signals, depending on the difference in transfer function between their audio channels. As such, the dynamic range compression scheme of DRC 20 compensates, at least partially, for this imbalance between audio channels.

In some embodiments, weight control unit 48 specifies the desired values of weights W1 and W2, and configures weighting units 32A and 32B to apply these weights. Weights W1 and W2 are numerical values that are used for multiplying ("scaling") the instantaneous amplitudes of the respective input signals $S1(t)$ and $S2(t)$. W1 and W2 may be fixed or they may change adaptively over time. Weight control unit 48 typically estimates (or is provided with an estimate of) the difference in transfer function between the audio channels of $S1(t)$ and $S2(t)$, and derives the values of weights W1 and W2 that compensate for this difference. The setting of weights may be fixed, e.g., upon power-up, or it may be adaptive. In an adaptive configuration, unit may track the difference in transfer function over time, and update weights W1 and/or W2 to continuously compensate for this difference.

In one non-limiting example, speaker 28A has a resonance frequency f1, and speaker 28B has a different resonance frequency f2. In such an embodiment, when input signal $S1(t)$ contains a substantial energy level at a frequency in the vicinity of f1, weight control unit 48 will set W1 to a value that will prevent distortion due to resonance of speaker 28A. Similarly, when input signal $S2(t)$ contains a substantial energy level at a frequency in the vicinity of f2, weight control unit 48 will set W2 to a value that avoids distortion. In either case, the resonance effects are prevented from severely affecting the instantaneous gain G(t).

In another non-limiting example, consider a case in which speakers 28A and 28B differ from one another in the transition point from linear to non-linear response. Speaker performance is commonly divided into "small-signal" and "large-signal" response. For signals in the small-signal range, the speaker response can be modeled as a linear response. For higher-energy signals, falling in the large-signal range, the speaker response cannot be modeled with sufficient accuracy as a linear response. Let Tls denote the instantaneous signal energy level at which a speaker transitions between small-signal (linear) and large-signal (non-linear) response.

Let Tls(A) and Tls(B) denote the Tls of speakers 28A and 28B, respectively. Consider an example scenario in which T1sA<T1sB. In this scenario, speaker 28A transitions to its non-linear range at a lower signal level, for which speaker 28B is still well within its linear range. A design goal in this scenario is to reduce the instantaneous gain of both signals ($S1(t)$ and $S2(t)$) if $S1(t)$>Tls(A) OR $S2(t)$>Tls(B). This condition checks the instantaneous amplitude of each input signal against the Tls of its corresponding speaker, and reduces the instantaneous gain (applied to both signals) only if any of the speakers is expected to transition into its non-linear range.

In such an embodiment, when $S1(t)$>Tls(A), weight control unit 48 will set W1 to a value that will prevent distortion due to non-linearity in speaker 28A. Similarly, when $S2(t)$>Tls(B), weight control unit 48 will set W2 to a value that will prevent distortion due to non-linearity in speaker 28B. In either case, speaker non-linearities are prevented from severely affecting the instantaneous gain G(t).

Additional Applications, Use-Cases and Variations

The configuration of DRC 20 shown in FIG. 1 is an example configuration that is depicted purely for the sake of conceptual clarity. In alternative embodiments, any other suitable configuration can be used. For example, DRC 20 may calculate the instantaneous gain G(t) in any other suitable way, based on the input signals and the weights. In the example of FIG. 1, the input signals are weighted by multiplying them by the respective weights. Alternatively, the weights may be applied to the input signals in any other way, e.g., by adding them to the input signals or using any other suitable function.

As another example, weighting units 32A and 32B may be placed at the outputs (rather than at the inputs) of ABS units 36A and 36B, respectively. Since the dynamic range compression is generally not a linear operation, the order in which the various operations are performed is meaningful and not merely a design choice.

In some embodiments, each of ABS units 36A and 36B may be replaced with a unit that calculates the Root-Means-Square (RMS) value of the weighted input signal, or with a peak-detection unit that outputs the peak value of the weighted input signal over some time interval, or with a peak-hold unit that latches to the peak value of the weighted input signal until it is reset. Any such unit may introduce some degree of "look-ahead" or latency between the weighted input signal and the application of the instantaneous gain (e.g., look-ahead limiting or compression).

As yet another example, DRC 20 may comprise more than two channels, e.g., four channels that process four respective input signals that carry the components of a quadrophonic audio signal. In such as embodiment, the DRC typically applies four weights to the four input signals, wherein at least two of the weights differ from one another.

The partitioning of the processing circuitry into units 32A, 32B, 36A, 36B, 40, 44 and 48 as shown in FIG. 1 is an example partitioning. In alternative embodiments, any other partitioning can be used. Elements of the processing circuitry, and of DRC 20 in general, which are not mandatory for understanding of the disclosed techniques, have been omitted from the figure for the sake of clarity.

In various embodiments, the different DRC elements shown in FIG. 1 may be implemented using any suitable hardware or firmware, such as using discrete components and/or in an Application-Specific Integrated Circuit (ASIC) or Field-Programmable Gate Array (FPGA). Alternatively, some of the elements of DRC 20 may be implemented in software, or using a combination of software and hardware elements.

In some embodiments, some or all of the elements of DRC 20 are implemented in a general-purpose programmable processor, e.g., a Digital Signal Processor (DSP) device, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

The description above referred mainly to compression of the dynamic range of the input signals. In alternative embodiments, the disclosed techniques can be used in a similar manner to apply any other suitable modification of the dynamic range, while also compensating for differences in transfer function between audio channels. For example, the disclosed techniques can be used for hard- or soft-limiting of the dynamic range, or for expansion of the dynamic range. As another example, the disclosed techniques can be used for de-essing the dynamic range (also referred to as "desibilizing"). De-essing is one example of a frequency-selective (e.g., filtering) operation on the dynamic range. As yet another example, the disclosed techniques can be used for gating the dynamic range, i.e., setting the output signal to zero if the input signal is below a threshold. Further alternatively, the disclosed techniques can be used for applying any other suitable operation to the dynamic range of the input signas.

The description above referred mainly to the application of sounding a stereo audio signal using a pair of loudspeakers. This choice was made purely for the sake of conceptual clarity. In alternative embodiments, the disclosed techniques can be used with various other kinds of audio channels that may be prone to transfer-function differences.

Consider, for example, a hearing aid having two earphones, one for each of the user's ears. In such an application, the two audio channels may differ in transfer function because the user's hearing ability may be better in one ear than in the other. The disclosed techniques can be used for dynamic range compression (or other mapping) in such a hearing aid, while at the same time compensating for the imbalance in hearing ability.

As another example, consider an application in which a mobile communication device (e.g., a mobile phone) plays a stereo signal. One audio channel (e.g., left) uses the device's internal loudspeaker as the electro-acoustic transducer, and the other audio channel uses the device's earpiece as the transducer. The disclosed techniques can be used for dynamic range compression (or other mapping) in such a device, while at the same time compensating for the transfer-function difference between the speaker and the earpiece.

Further alternatively, the disclosed techniques can be used in any other suitable system, application or use-case having audio channels that differ in transfer function.

Although the embodiments described herein mainly address an integrated device for dynamic-range processing for two stereo speakers in that differ in electro-acoustic performance, the methods and systems described herein can also be used in other applications, such as in Public Announcement (PA) systems, live concert amplification, hearing aids, and many others.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for audio processing, comprising:
receiving first and second electrical signals comprising respective left and right components of a stereo signal, to be transmitted in parallel via respective first and second audio channels;
assigning respective first and second weights to the first and second electrical signals, wherein the first and second weights differ from one another;
calculating a same instantaneous gain to be applied to both the first and the second electrical signals, wherein the same instantaneous gain depends on (i) first and second instantaneous amplitudes of the first and second electrical signals, and (ii) the first and second weights assigned to the first and second electrical signals; and
applying the same instantaneous gain to the first and second electrical signals, and transmitting the first and second electrical signals via the first and second respective audio channels.

2. The method according to claim 1, wherein assigning the weights comprises setting the weights so as to compensate for a difference in transfer function between the first and second audio channels.

3. The method according to claim 1, wherein calculating and applying the same instantaneous gain comprises mapping a dynamic range of the first and second electrical signals from a first dynamic range to a second, different dynamic range.

4. The method according to claim 1, wherein calculating the same instantaneous gain comprises (i) applying the first and second weights to the first and second electrical signals, so as to produce first and second weighted signals, (ii) calculating respective first and second absolute values of the first and second weighted signals, and (iii) calculating the same instantaneous gain based on an instantaneous maximum of the first and second absolute values.

5. The method according to claim 1, wherein assigning the weights comprises setting the first and second weights so as to compensate for a difference between respective resonance frequencies of the first and second audio channels.

6. The method according to claim 1, wherein assigning the weights comprises setting the first and second weights so as to compensate for a difference between respective non-linear response ranges in the first and second audio channels.

7. An apparatus for audio processing, comprising:
processing circuitry, configured to:
receive first and second electrical signals comprising respective left and right components of a stereo signal, which are to be transmitted in parallel via respective first and second audio channels;
assign respective first and second weights to the first and second electrical signals, wherein the first and second weights differ from one another; and
calculate a same instantaneous gain to be applied to both the first and the second electrical signals, wherein the same instantaneous gain depends on (i) first and second instantaneous amplitudes of the first and second electrical signals, and (ii) the first and second weights assigned to the first and second electrical signals; and
first and second gain stages, which are configured to apply the same instantaneous gain to the first and second electrical signals, and to transmit the first and second electrical signals via the respective first and second audio channels.

8. The apparatus according to claim 7, wherein the processing circuitry is configured to set the first and second weights so as to compensate for a difference in transfer function between the first and second audio channels.

9. The apparatus according to claim 7, wherein, in calculating and applying the same instantaneous gain, the processing circuitry is configured to map a dynamic range of the first and second electrical signals from a first dynamic range to a second, different dynamic range.

10. The apparatus according to claim 7, wherein the processing circuitry is configured to calculate the same instantaneous gain by (i) applying the first and second weights to the first and second electrical signals so as to produce first and second weighted signals, (ii) calculating respective first and second absolute values of the first and second weighted signals, and (iii) calculating the same instantaneous gain based on an instantaneous maximum of the first and second absolute values.

11. The apparatus according to claim 7, wherein the processing circuitry is configured to set the first and second weights so as to compensate for a difference between respective resonance frequencies of the first and second audio channels.

12. The apparatus according to claim 7, wherein the processing circuitry is configured to set the first and second weights so as to compensate for a difference between respective non-linear response ranges in the first and second audio channels.

* * * * *